United States Patent
Abbott et al.

(10) Patent No.: US 7,453,334 B1
(45) Date of Patent: Nov. 18, 2008

(54) LEAKY SAW RESONATOR AND METHOD

(75) Inventors: Benjamin P. Abbott, Longwood, FL (US); Joshua J. Caron, Oak Ridge, NC (US); Steven Garris, DeBary, FL (US)

(73) Assignee: Triquint Semiconductor, Inc., Orlando, FL (US)

( * ) Notice: Subject to any disclaimer, the term of this patent is extended or adjusted under 35 U.S.C. 154(b) by 225 days.

(21) Appl. No.: 11/277,052

(22) Filed: Mar. 21, 2006

Related U.S. Application Data

(60) Provisional application No. 60/663,828, filed on Mar. 21, 2005.

(51) Int. Cl.
  *H03H 9/145* (2006.01)
  *H03H 9/25* (2006.01)
  *H03H 9/64* (2006.01)

(52) U.S. Cl. .............. 333/195; 310/313 D; 310/313 B; 333/193

(58) Field of Classification Search .......... 333/193, 333/195, 196; 310/313 B, 313 C, 313 D
See application file for complete search history.

(56) References Cited

U.S. PATENT DOCUMENTS

| | | | | |
|---|---|---|---|---|
| 4,999,535 A | * | 3/1991 | Mariani et al. | 310/313 B |
| 6,072,377 A | * | 6/2000 | Tajima et al. | 333/154 |
| 6,404,101 B1 | * | 6/2002 | Taniguchi et al. | 310/313 A |
| 6,946,931 B2 | * | 9/2005 | Inoue et al. | 333/195 |

FOREIGN PATENT DOCUMENTS

| | | | | |
|---|---|---|---|---|
| JP | 3-158014 | * | 7/1991 | 333/193 |
| JP | 6-164297 | * | 6/1994 | 333/195 |
| JP | 11-298286 | * | 10/1999 | |

OTHER PUBLICATIONS

Machine translation (detailed description) of Hirota JP 11-298286, Oct. 1999, six pages.*

* cited by examiner

*Primary Examiner*—Barbara Summons
(74) *Attorney, Agent, or Firm*—Allen, Dyer, Doppelt, Milbrath & Gilchrist, P.A.

(57) ABSTRACT

A SAW ladder filter includes grating pads extending from opposing bus bars and interdigital transducer electrodes extending from the grating pads for defining an acoustic aperture. The metalization ratio for the grating pads is greater than that for the interdigital transducer electrodes. Reflector electrodes are disposed on opposing longitudinal sides of the interdigital transducer electrodes. Operation of the filter results in a velocity of the SAW along the grating pads slower than a SAW velocity along the plurality of interdigital transducer electrodes, thus producing a wave guiding effect for optimizing SAW propagation within the acoustic aperture. The grating pads may be longitudinally offset from cooperating interdigital transducer electrodes using minor bus bars.

30 Claims, 16 Drawing Sheets

# LEAKY SAW RESONATOR AND METHOD

CROSS-REFERENCE TO RELATED APPLICATION

This application claims the benefit of U.S. Provisional Application No. 60/663,828 for "Leaky SAW Resonator and Method" having filing date Mar. 21, 2005, the disclosure of which is incorporated herein by reference in its entirety, all being commonly owned.

FIELD OF INVENTION

The present invention generally relates to surface acoustic wave devices, and particularly to surface acoustic wave resonators having improved energy characteristics.

BACKGROUND OF THE INVENTION

Surface Acoustic Wave (SAW) resonators have been widely applied to the design of surface acoustic wave filters for use in many different communication systems. FIG. 1 depicts a typical SAW resonator, its symbol, and equivalent circuit. The SAW resonator, which generally comprises a transducer embedded between two reflectors, may be fabricated on a single crystal piezoelectric substrate of lithium niobate or lithium tantalate. The transducer is typically a two terminal device with alternating finger electrodes extending from the two opposing bus bars. When an alternating voltage is applied across the bus bars, surface waves are launched generally in a direction normal to the electrodes. The SAW resonator, depending upon the angle cut of the substrate, can either support Raleigh-type surface acoustic waves or leaky shear waves. Using a cut angle of 42° Y-X cut of lithium tantalate, the SAW transducer will predominantly launch leaky shear wave components. It is well known that leaky surface acoustic wave resonators exhibit radiation losses over a range of frequencies. Miyamoto et al. (2002 IEEE Ultrasonics Symposium) has shown a direct observation of the wave radiations extending beyond the normal overlapping area of the transducer aperture into the bus bar regions. When configured as a band pass filter, this radiation of leaky waves into the bus bars is manifested as extra insertion loss at certain frequencies, often causing notches or ripples in the pass band. Depending upon the frequency dependence of the radiation of the leaky waves, the performance degradation may be pronounced near the pass band center or it may occur mostly near one or both pass band edges, thus reducing the usable bandwidth and quality factor, Q, of the filter.

When studying the effects of radiation on single SAW resonators, it is useful to examine the frequency dependent quality factor (Q) of the resonator. Q is defined as the ratio of the stored energy to the dissipated energy in a half cycle. It can be measured in a variety of ways. Q of a resonator can accurately be measured at two specific frequency points as follows:

$$Q = \frac{1}{2}\omega_r \frac{\partial}{\partial \omega}\left(\tan^{-1}\frac{B}{G}\right)\bigg|_{\omega=\omega_r}$$

$$Q = \frac{1}{2}\omega_a \frac{\partial}{\partial \omega}\left(\tan^{-1}\frac{B}{G}\right)\bigg|_{\omega=\omega_a}$$

where $\omega_r$ and $\omega_a$ are the respective resonant and antiresonant frequencies of the resonator, B is the imaginary part of the admittance (denoted susceptance), and G is the real part of the admittance (denoted conductance). FIG. 2 shows a plot of G and B for a typical SAW resonator. The resonant frequency corresponds to the lower of the two frequency points where B crosses zero and undergoes a sign change. From the admittance measurement, Q at exactly two frequency points ($\omega_r$ and $\omega_a$) can be determined. In order to measure the Q at other frequencies, a technique can be employed to arbitrarily shift the resonant or anti-resonant frequency of the filter. The anti-resonant frequency, as shown in FIG. 2, corresponds to the higher zero-crossing frequency of the susceptance, B. By adding or subtracting an arbitrary amount, $\Delta B$, to the susceptance, the anti-resonant frequency can be arbitrarily shifted up or down, as shown in FIG. 3. $Q_a$ at each of those frequency points can be measured as described above. For Q measurements below the center of the stop band, a similar technique can be used to shift the resonant frequency. In this case an arbitrary offset is applied to the imaginary part of the impedance (denoted as the reactance, and usually abbreviated X; the real part of the impedance is called the resistance, and is abbreviated R).

By combining the two techniques described above, Q can be measured over a wide frequency range encompassing the entire pass band and beyond. The resonant and anti-resonant Q's in a modeling can be controlled by slightly modifying ("tweaking") the values of the motional resistance, $R_m$, and the static conductance, $g_0$. Generally, these "lossy" elements are considered to be constant with frequency. There are certain frequency bands where Q is significantly degraded by some frequency-dependent phenomenon.

While there are several mechanisms at work to degrade the Q (e.g. thin film resistance, elastic and dielectric losses in the substrate, spectral conversion of surface wave energy into bulk modes, etc.), most vary rather slowly with frequency and, therefore, would not be responsible for such volatility in the Q. Instead, the likely culprit is radiation losses. Radiation losses occur at pronounced frequencies where the physical geometry of the resonator permits the resonance of a transversal acoustic mode that radiates energy away from the active area of the resonator. At other nearby frequencies, this same phenomenon can behave in the opposite manner, trapping the energy within the active area, leading to much higher Q's at those frequencies.

FIG. 4 includes a schematic drawing of a typical SAW resonator in which acoustic energy that has leaked out of the active area of the interdigital transducer propagates towards the opposing bus bars. Within the aperture (A) of the transducer, on the other hand, almost no energy leaks out the resonator, because of the reflective gratings of the reflectors at each end. Radiation in leaky surface acoustic wave resonators is difficult to accurately model and is, therefore, quite poorly understood. One method for suppressing the effects of this type of radiation is to increase the aperture of the resonator. As the aperture becomes larger and larger, phenomena taking place at the edges become less and less significant. However, it is not always practical to construct filters using resonators with large apertures. For a constant area providing a fixed capacitance value, an increase in aperture requires a corresponding decrease in length i.e. a reduction in the number of finger pairs of the transducer. This reduction of transducer length results in an increase in spectral losses and resistive losses, both of which adversely affect the Q of the filter.

Shiba et al. (2004 Ultrasonics Symposium) presents yet another method to suppress radiation loss in which the SAW transducer, as depicted in FIG. 5, has a grating of pads connecting to the bus bar. The additional grating bus bar pads effectively reduce the radiation loss. However, it is found, by Shiba et al. that the reduction of radiation is optimized at about one wavelength. Further, an increment in the bus bar grating pad actually has an adverse effect on the loss of the filter.

The effects of radiation can also be compensated in some cases by shifting the transverse resonances to other frequencies where the impact is not as great. Such techniques are largely trial-and-error, and they usually involve much experimentation with various combinations of length, gap and metalization ratio of the active electrodes. Ruile et al. (US 2004/0247153) teaches the technique in which the impact of radiation effect is reduced by varying the gap region and the length of the active electrodes as shown in FIG. 6. However, the varying overlap of the active aperture results in an apodization loss, which would degrade the Q of the resonator.

SUMMARY OF THE INVENTION

Embodiments of the present invention reduce radiation loss and its effects in a leaky SAW resonator. Embodiments of the present invention improve the Q of the resonator to enhance the filter performance. One embodiment may comprise a SAW filter having a piezoelectric substrate and transversely opposing bus bars longitudinally disposed on a surface with a plurality of grating pads transversely extending inwardly along the surface from each of the bus bars, and interdigital transducer electrodes disposed along a longitudinal axis on the surface for defining an acoustic aperture across overlapping interdigital transducer electrodes within a transverse dimension thereof, wherein each of the plurality of interdigital electrodes extends from each of the plurality of grating pads, and wherein a metalization ratio for the plurality of grating pads is substantially different from a metalization ratio for the plurality of interdigital transducer electrodes. The metalization ratio of the bus bar grating pad is defined as a ratio of a width dimension of the grating pad and a corresponding periodic separation distance dimension between adjacent grating pads for each of the plurality of grating pads. Similarly, the metalization ratio of the transducer electrode is defined as a ratio of the transducer electrode width to a corresponding periodic separation distance dimension between adjacent transducer electrodes.

Increasing the metalization ratio of the grating bus bar pads results in the reduction of the velocity of the bus bar grating pad so that the wave velocity of the grating is slower than the wave velocity of the transducer. The slower velocity of the grating bus bar pads produces a wave guiding effect to maintain the wave's propagation within the active area of the transducer aperture.

For one leaky SAW resonator of the present invention, a SAW transducer is embedded between reflectors, wherein the metalization ratio of the grating bus bar pads differ significantly from the metalization ratio of the corresponding active electrode fingers. The resonators may be used in a series arm and parallel arm to form a SAW ladder filter. By way of example, the present invention may include a SAW resonator having a transducer embedded between reflectors, wherein the transducer comprises two opposing bus bars, the bus bar grating pads and electrode fingers. The electrode fingers extend from the bus bar grating pads and form an acoustic aperture across an overlap region of the finger electrodes within the transducer. The metalization ratio of the bus bar grating pads is significantly greater than the metalization ratio of the electrode fingers along the transducer acoustic aperture. By way of example, the metalization ratio of the bus bar grating pads may be between 5% to 40% greater than the metalization ratio of the electrode fingers along the transducer acoustic aperture. The transducer metal pattern may comprise at least one of the Al, Mg, Ti, Cu, Au or its alloy.

By way of further example, the invention may include a SAW resonator having a transducer embedded between reflectors, wherein the transducer comprises two opposing bus bars, the bus bar grating pads, a minor bus bar joining the top end of the grating pads and electrode fingers. The electrode fingers may extend from the minor bus bar and form an acoustic aperture across the overlap region of the finger electrodes within the transducer. The metalization ratio of the bus bar grating pads is significantly greater than the metalization ratio of the electrode fingers along the transducer acoustic aperture, wherein the height of the minor bus bar joining the grating pads is less than that of the grating pads.

Yet further, a SAW resonator having a transducer embedded between reflectors may comprise two opposing bus bars, the bus bar grating pads, and electrode fingers. The electrode fingers extend from the bus bar and form an acoustic aperture across the overlap region of the finger electrodes within the transducer. The metal thickness at the grating pads is substantially thicker than the metal thickness at the overlap finger electrodes.

The transducer may comprise two opposing bus bars, the bus bar grating pads, and electrode fingers, the electrode fingers extending from the bus bar and forming an acoustic aperture across the overlap region of the finger electrodes within the transducer, wherein the metal type at the grating pad or bus bar is of a different type than that of the electrode fingers.

Yet further, embodiments may include a SAW ladder filter comprising SAW resonators arranged in the series and parallel arm forming a ladder filter network. The SAW resonator may have a transducer embedded between reflectors. The transducer may comprise two opposing bus bars, the bus bar grating pads, and electrode fingers. The electrode fingers may extend from the bus bar and form an acoustic aperture across the overlap region of the finger electrodes within the transducer. The metalization ratio of the bus bar grating pads is significantly greater than the metalization ratio of the electrode fingers along the transducer acoustic aperture, wherein the aperture of the series arm SAW resonator is less than twenty wavelengths and that of the parallel arm SAW resonator is greater than 30 wavelengths.

BRIEF DESCRIPTION OF DRAWINGS

Embodiments of the invention are described, by way of example, with reference to the accompanying drawings in which.

DETAILED DESCRIPTION OF EMBODIMENTS

The present invention will now be described more fully with reference to the accompanying drawings in which alternate embodiments of the invention are shown and described. It is to be understood that the invention may be embodied in many different forms and should not be construed as limited to the illustrated embodiments set forth herein. Rather, these embodiments are provided so that this disclosure may be thorough and complete, and will convey the scope of the invention to those skilled in the art.

Figure 1A:
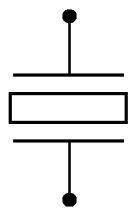
FIGS. 1, 1A, and 1B are diagrammatical views of a SAW resonator, a commonly used symbol for the resonator, and an equivalent circuit, respectively.
Figure 1B:
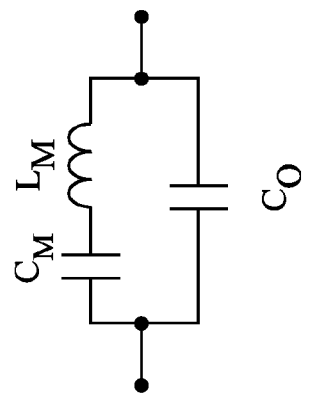
Figure 1:
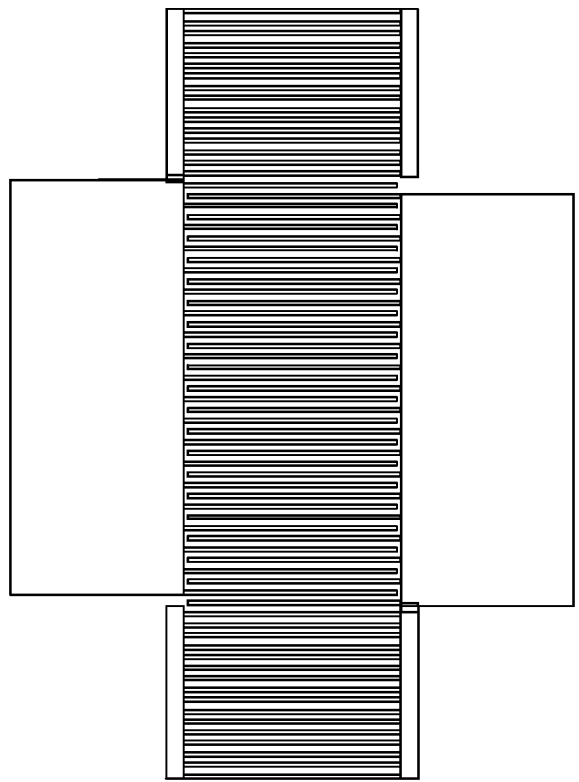
Figure 2:
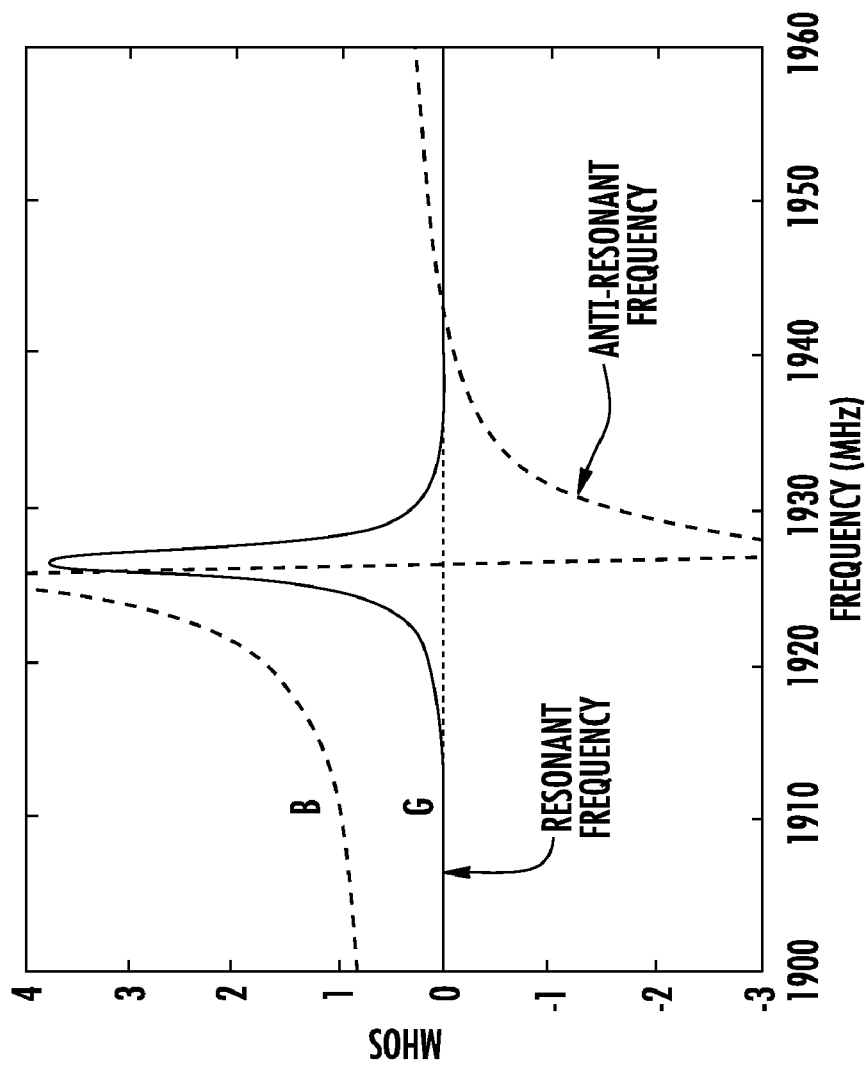
FIG. 2 is a plot illustrating real (G) and imaginary (B) portions of admittance for a typical SAW resonator.
Figure 3:
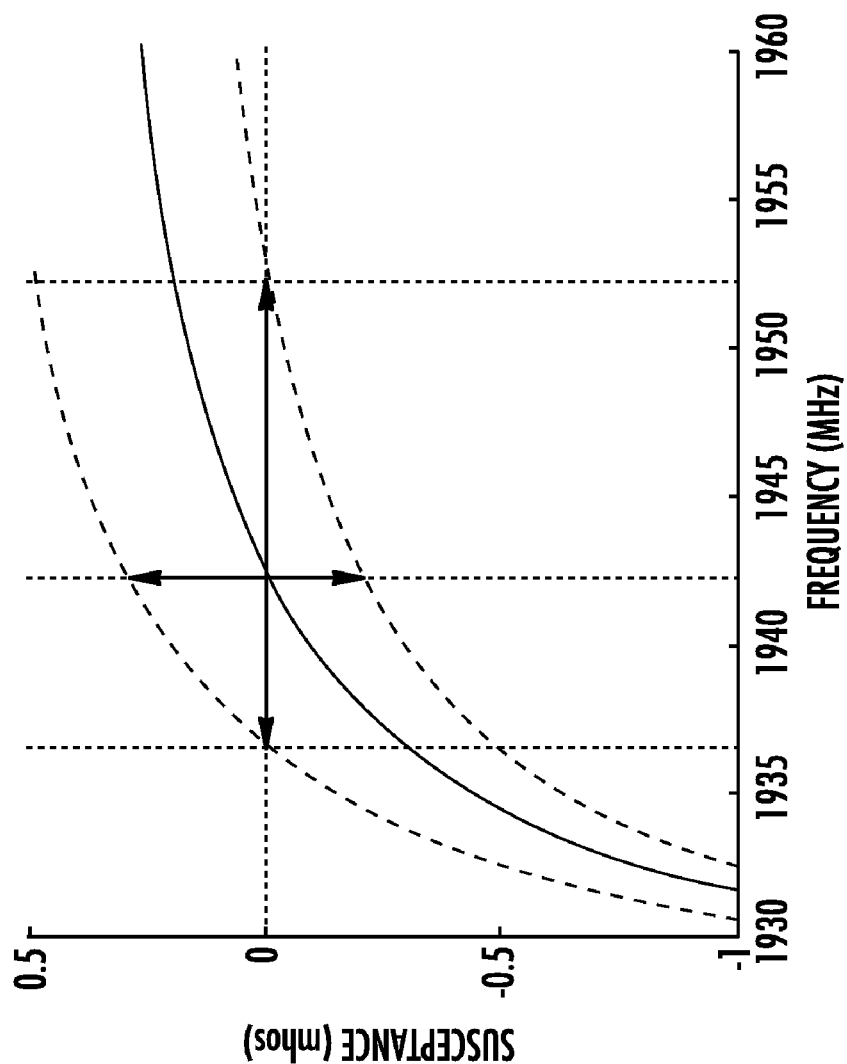
FIG. 3 is a plot of susceptance versus frequency illustrating that anti-frequency may be shifted up or down over a wide frequency range by modifying the susceptance.
Figure 4:
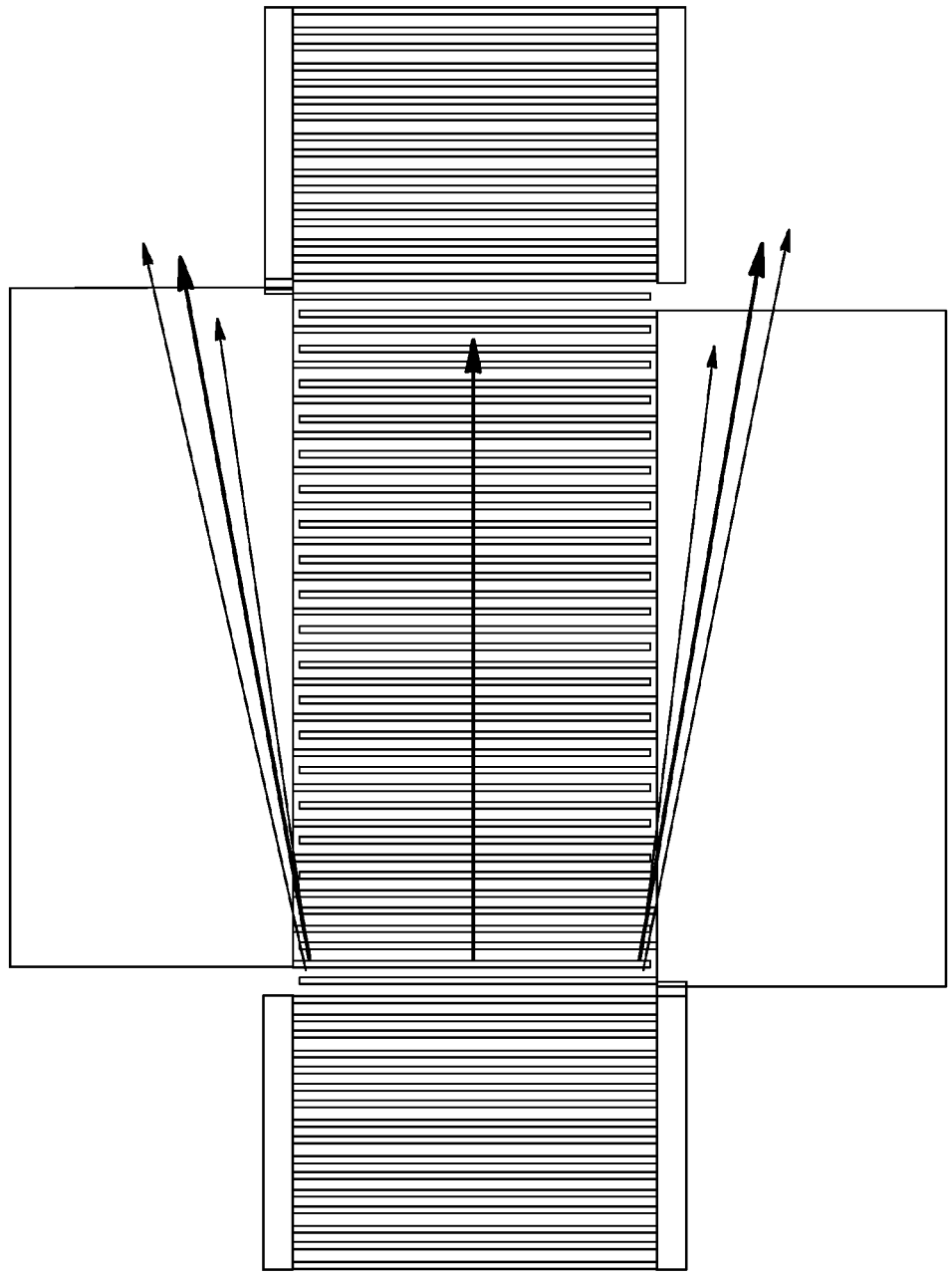
FIG. 4 is a diagrammatical play view of a typical SAW resonator illustrating acoustic energy leakage from an active electrode region.
Figure 5:
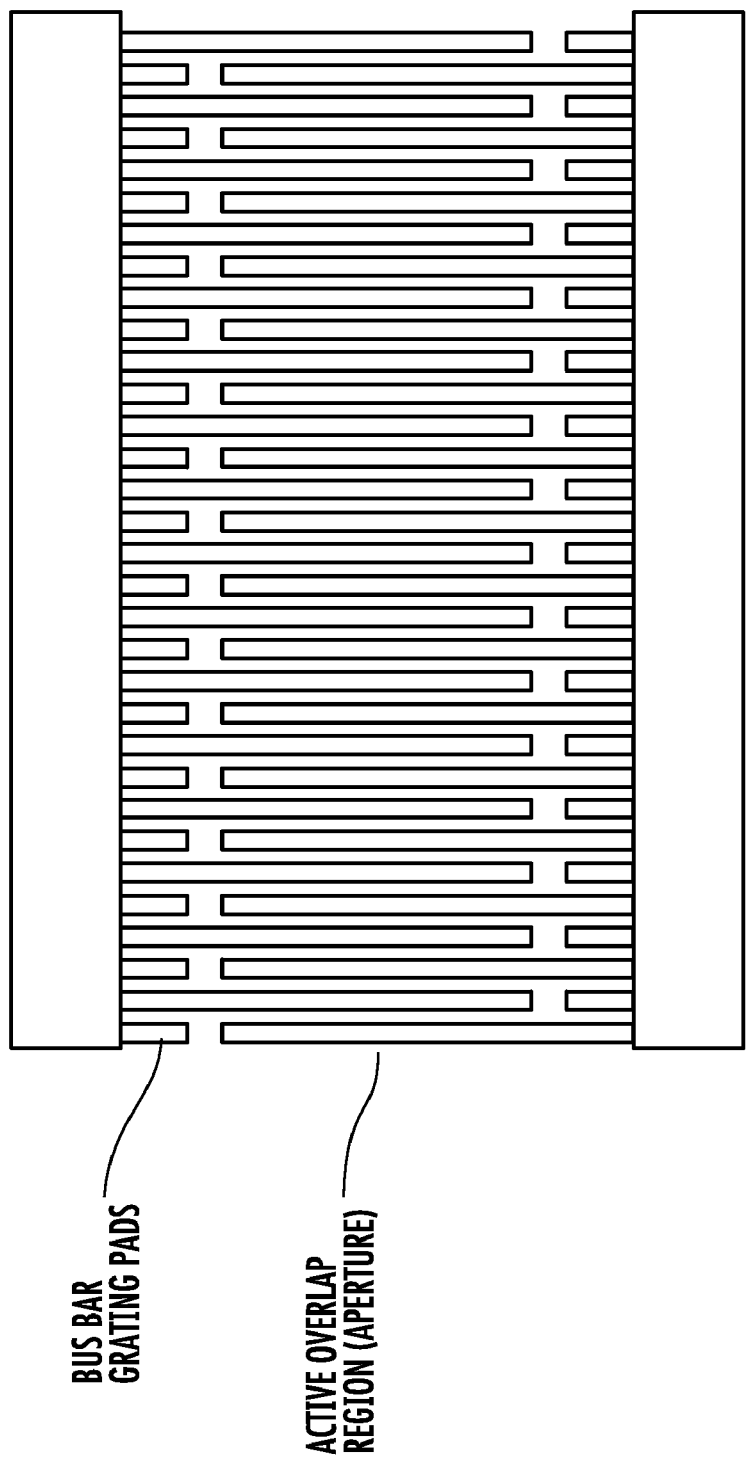
FIG. 5 is a diagrammatical plan view of a known SAW transducer employer bus bar grating.
Figure 6:
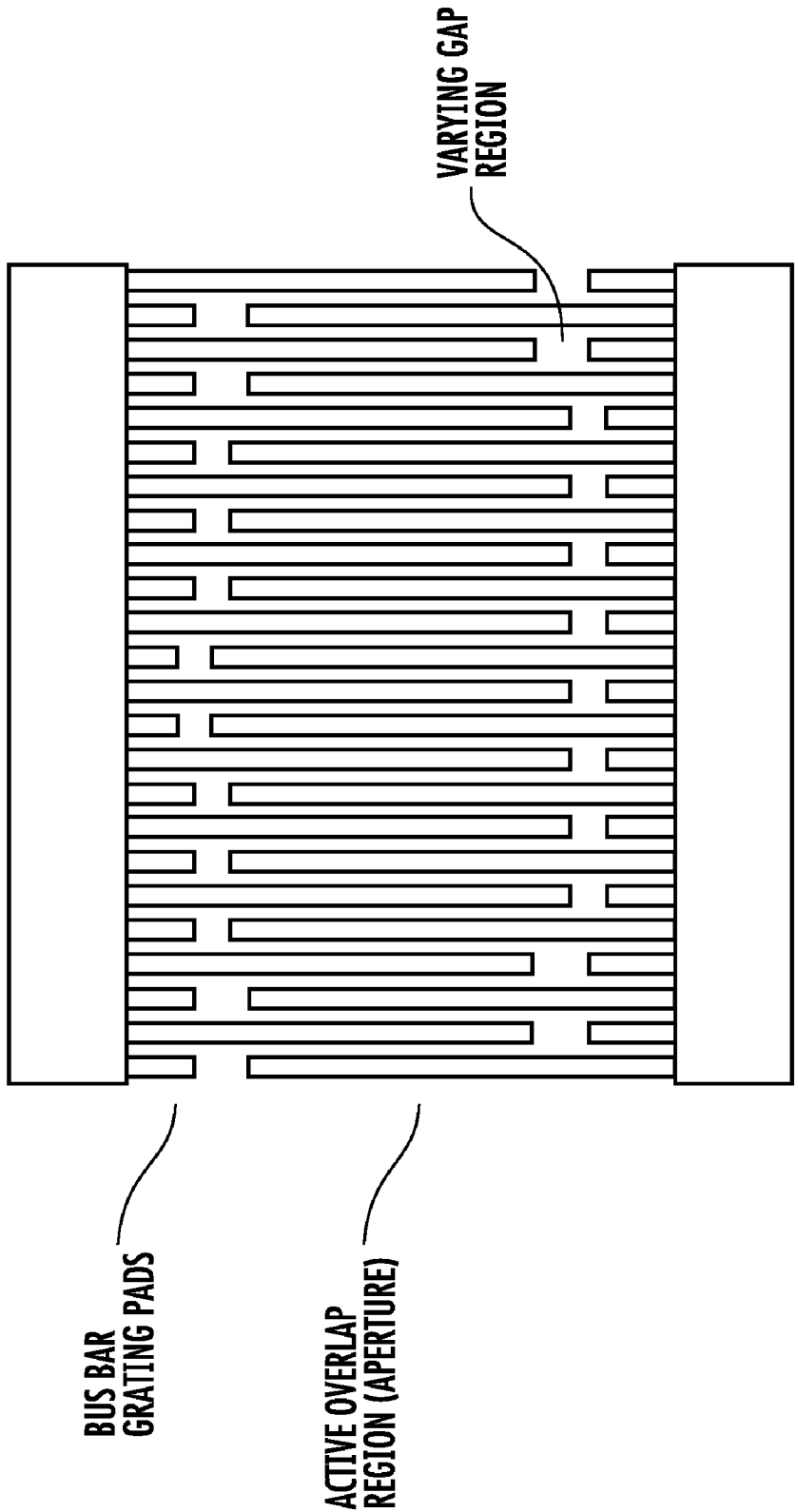
FIG. 6 is a diagrammatical plan view of a known SAW transducer employing a bus bar grating and a modified gapping with electrodes in an effort to reduce radiation effects on a passband.
Figure 7:
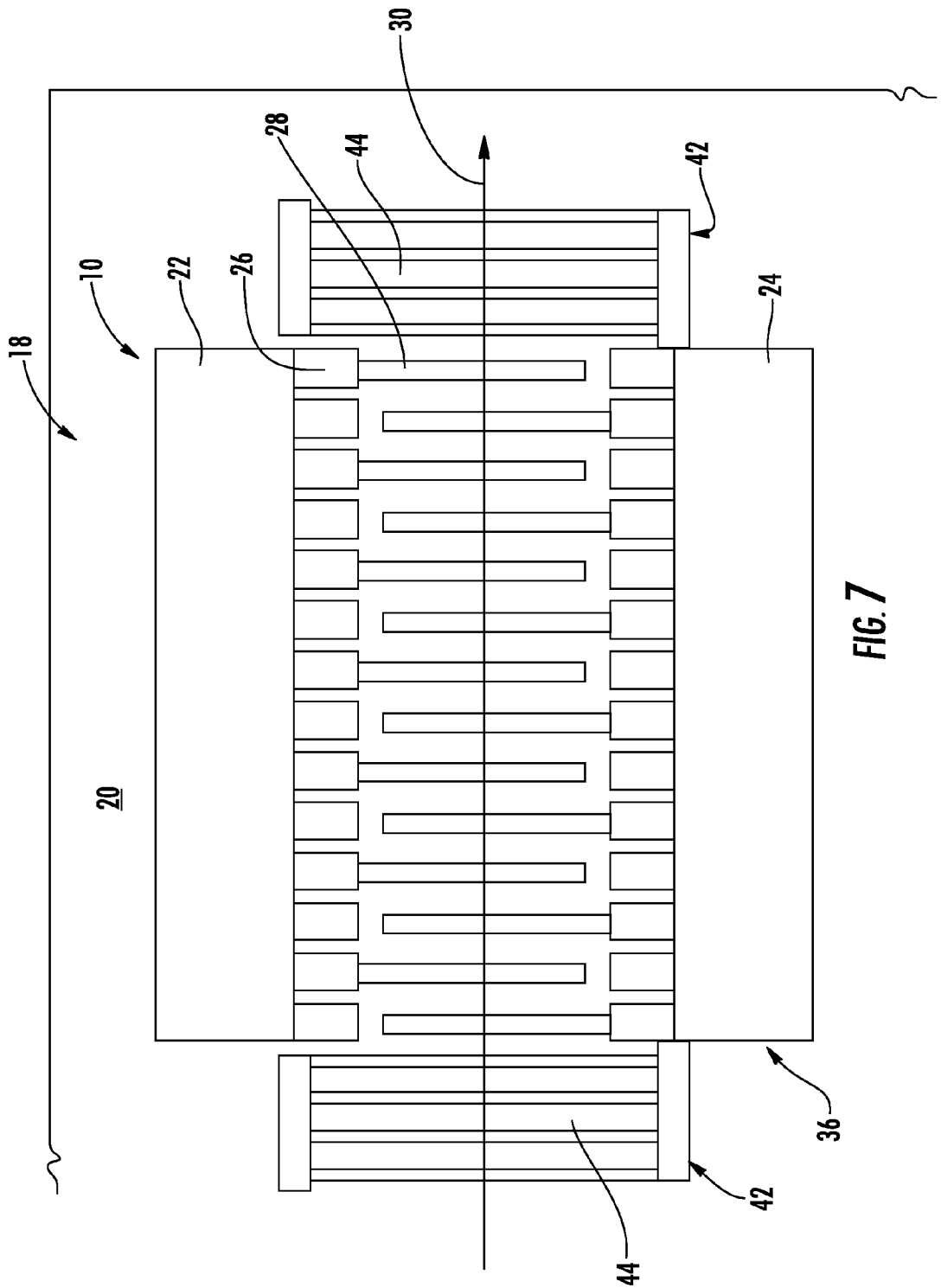
FIG. 7 is one embodiment of a SAW resonator in keeping with the teachings of the present invention illustrating a transducer embedded between reflectors.
Figure 8:
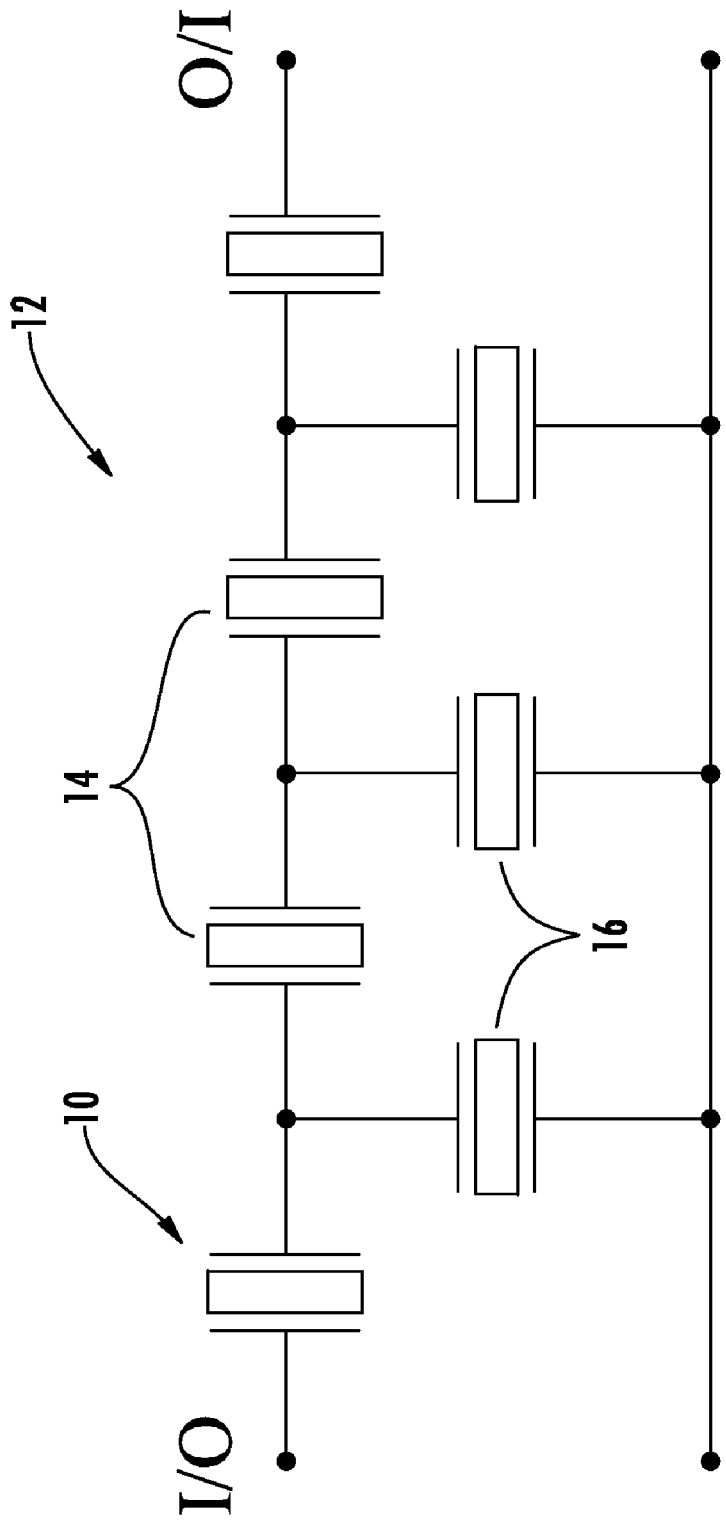
FIG. 8 is a schematic illustration of a ladder filter.

With reference now to FIGS. 7 and 8, one embodiment of the present invention includes a SAW resonator 10 that is operable with a SAW ladder filter 12 having at least one resonator in a series arm 14 and at least one resonator in a parallel arm 16 to form the ladder filter. With continued reference to FIG. 7, the resonator 10 comprises a piezoelectric substrate 18 having a surface 20 for supporting SAW propagation. Transversely opposing first and second bus bars 22, 24 are longitudinally disposed on the surface 20. Grating pads 26 transversely extend inwardly along the surface 20 from each of the first and second opposing bus bars 22, 24. Interdigital transducer electrodes 28 are disposed along a longitudinal axis 30 on the surface 20 for defining an acoustic aperture 32 across overlapping interdigital transducer electrodes 28 within a transverse dimension 34 of the formed transducer 36 as illustrated with reference to FIG. 9. By way of example, the interdigital transducer electrodes 28 are electrically connected to a corresponding grating pad 26 extending from the first bus bar 22, and an adjacent electrode 28A is electrically connected to a second grating pad 26A electrically connected to the second bus bar 24. For the embodiment herein described, a first portion of the plurality of interdigital transducer electrodes 28 extends from every other grating pad 26 operable with the first bus bar 22, and a second portion of the plurality of interdigital transducer electrodes 28 extends from every other grating pad 26 associated with the second bus bar 24 so as to form overlapping fingers elements herein referred to the interdigital transducer electrodes 28.

For the embodiment herein described by way of example, each interdigital electrode 28 extends from one grating pad 26 with a metalization ratio for the plurality of grating pads 26 substantially different from a metalization ratio for the plurality of interdigital transducer electrodes 27. The metalization ratio is herein defined as a ratio between a width dimension 38G, 38E and a corresponding separation distance dimension 40G, 40E, respectively, as illustrated with continued reference to FIG. 9. With reference again to FIG. 7, the resonator 10 includes reflectors 42 having reflector electrodes 44 disposed on the surface 20 of the piezoelectric substrate 18 on opposing longitudinal sides of the transducer 36.

For the embodiment herein described by way of example, the metalization ratio for each of the grating pads 26 is greater that the metalization ratio for the interdigital transducer electrodes 28. One embodiment includes the metalization ratio for the plurality of grating pads 26 to be between 5% and 40% greater than the metalization ratio for the interdigital transducer electrodes 28. Embodiments may include the transducer electrodes 28 fabricated from Al, Mg, Ti, Cu, Au, or an alloy thereof. Further, the metallic material used to form each of the plurality of grating pads may be different from the metallic material used to form each of the plurality of interdigital transducer electrodes.

Figure 10:
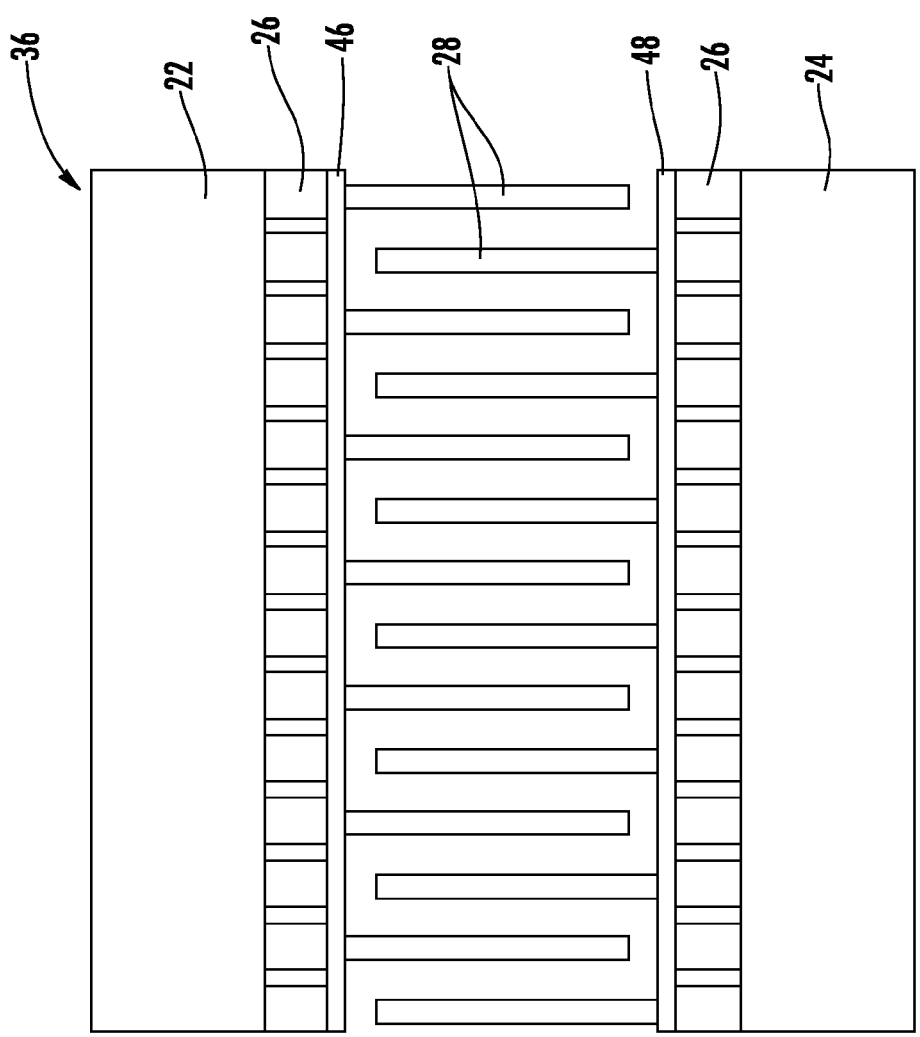
FIG. 10 is a second embodiment in keeping with the teachings of the present invention illustrating use of minor bus bars for reducing resistive loss of grating pads.
Figure 11:
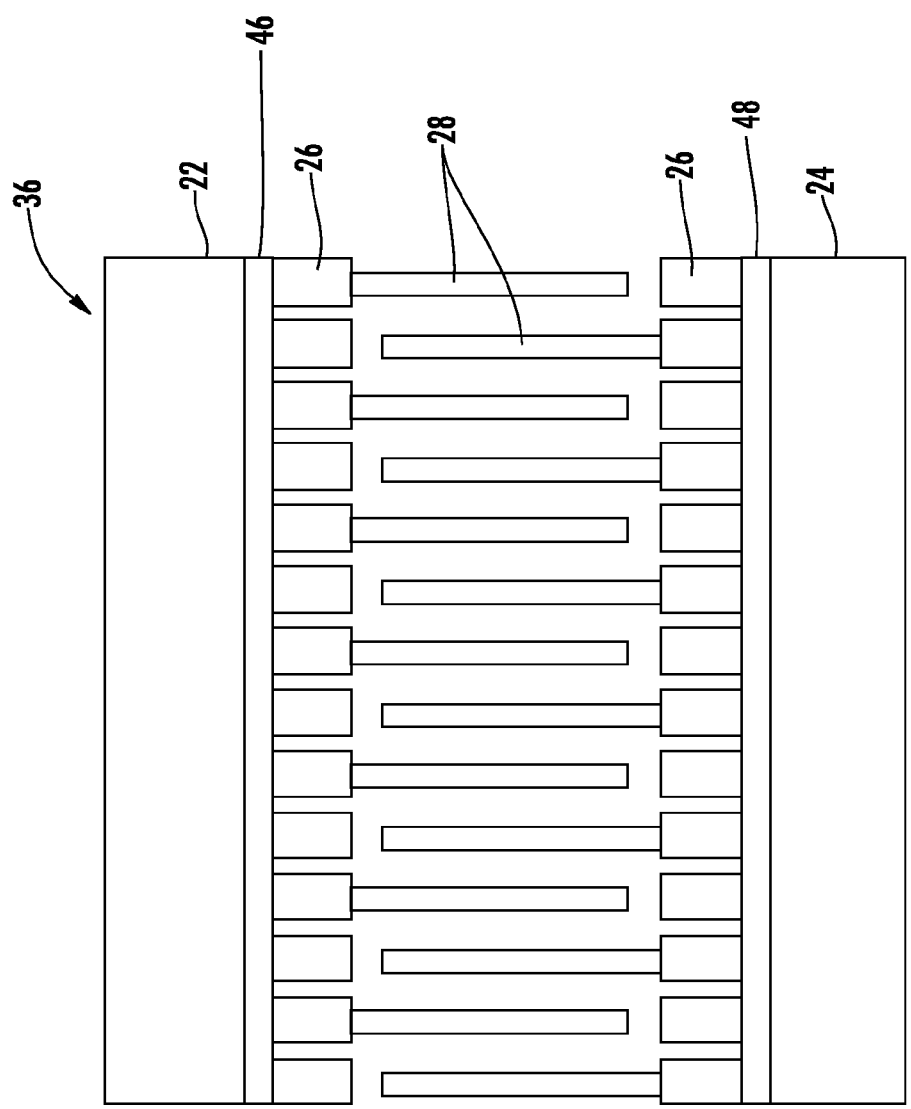
FIG. 11 is another embodiment in keeping with the teachings of the present invention illustrating use of minor bus bars positioned between first and second bus bars and the grating pads, wherein transducer electrodes are directly connected to the grating pads.
Figure 12:
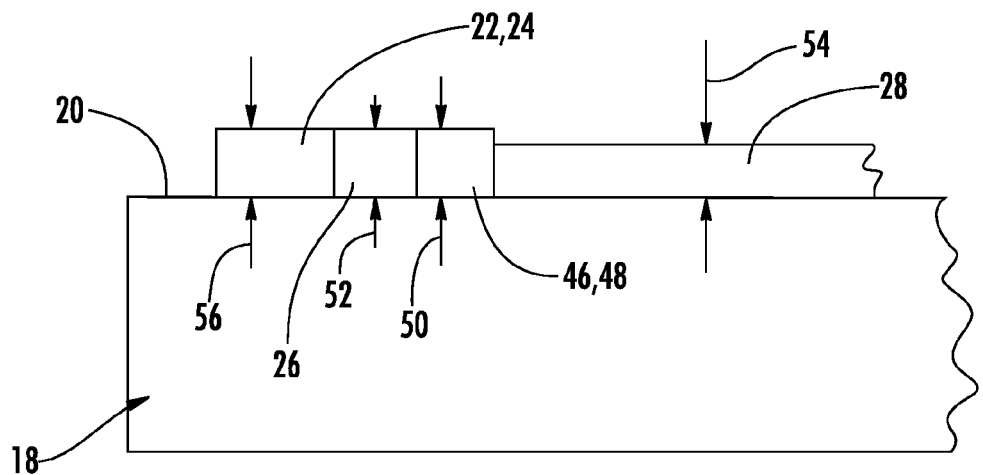
FIGS. 12 and 12A are partial elevation view illustrating height dimensions for bus bars, grating pads, and transducer electrodes, by way of example.
Figure 12A:
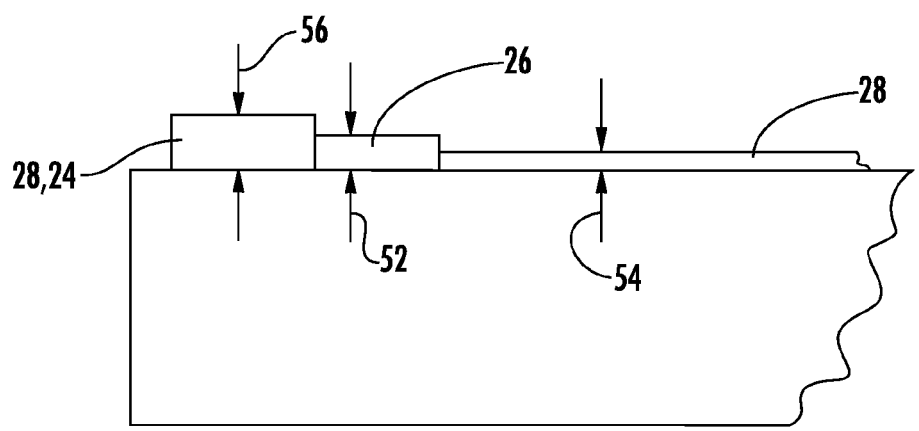

As illustrated with reference to FIGS. 10 and 11, first and second minor bus bars 46, 48 may be disposed between each of the opposing bus bars 22, 24 and the grating pads 26, as illustrated with reference to FIG. 11, or between the grating pads 26 and the interdigital transducer electrodes 28, as illustrated with reference to FIG. 10. As illustrated with reference to FIG. 12, for one embodiment herein described by way of example, a height dimension 50 for each of the opposing first and second minor bus bars 46, 48 is that of a height dimension 62 for the grating pads 26 and may be unlike a height dimension 54 for the interdigital transducer electrodes 28. As illustrated with reference to FIG. 12A, the grating pads 26, the electrodes 28, may take on various height dimensions when compared to the height dimension 56 for the bus bars 22, 24. Desirably, the height dimension 56 for each of the bus bars 22, 24 may be sufficiently greater than a corresponding height dimension 54 for each of the plurality of interdigital transducer electrodes 28 for reducing SAW energy leakage into the opposing bus bars 22, 24.

Figure 13:
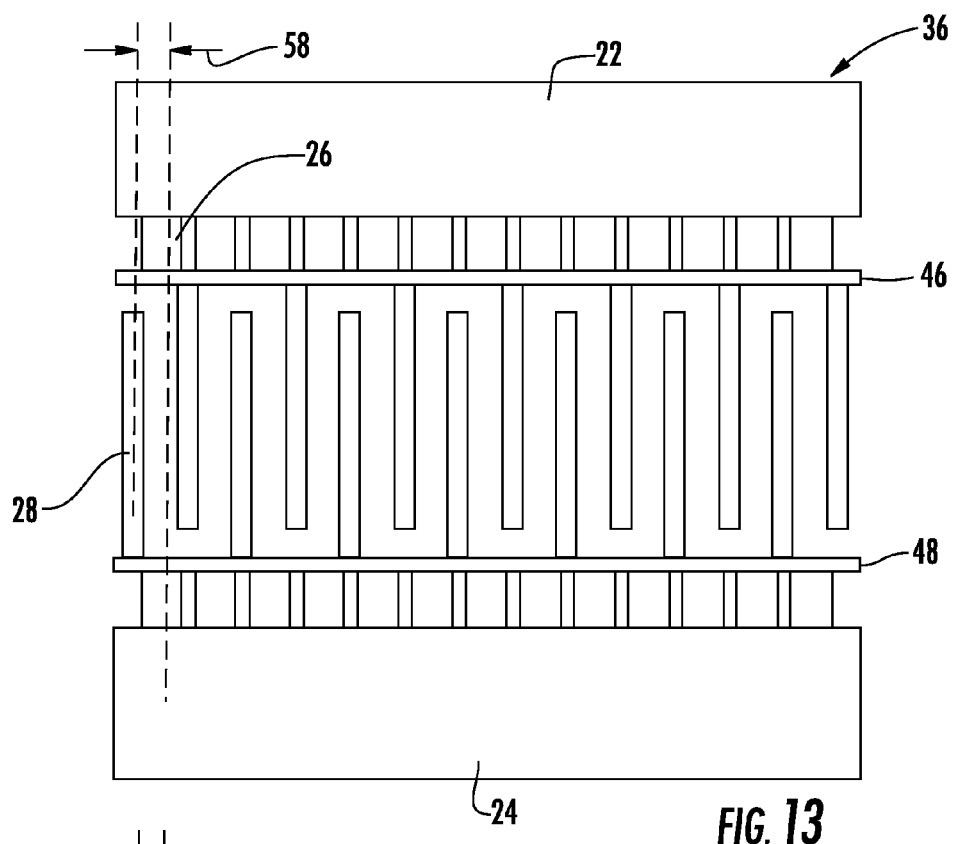
FIGS. 13 and 13A are partial diagrammatical plan views of transducers in keeping with the teachings of the present invention illustrating a half period shifting of the grating pads relative to electrodes of the transducer, and a half period shifting of the grating pads extending from one minor bus bar to the grating pads extending from an opposing minor bus bar, respectively.
Figure 13A:
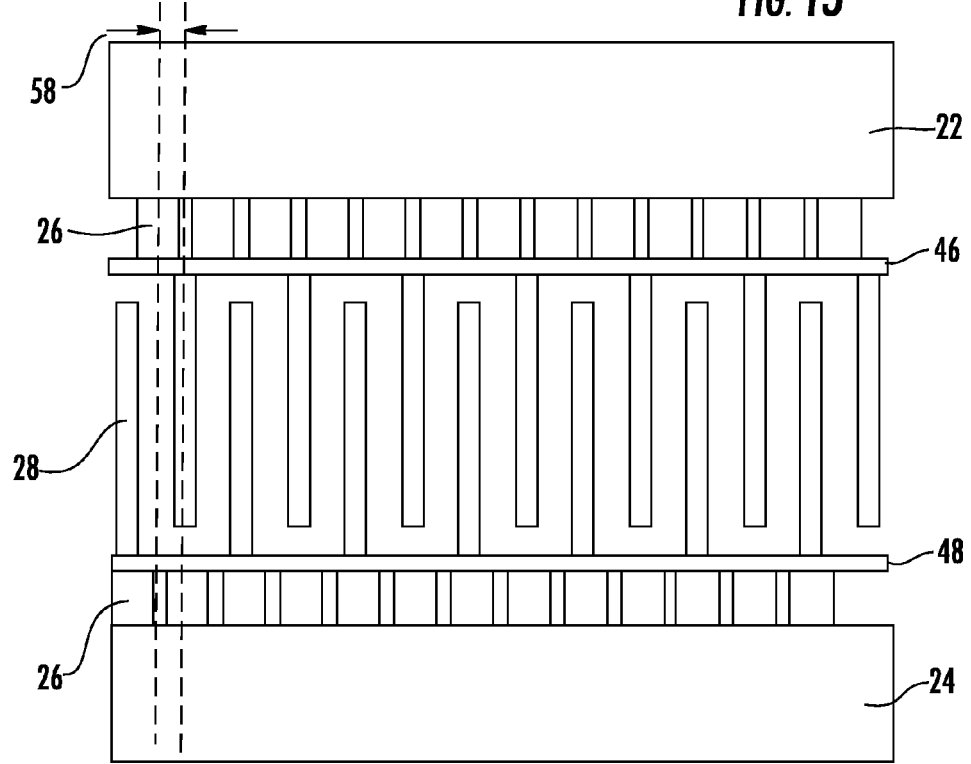

As illustrated with reference to FIG. 13, one embodiment of the invention may include each of the plurality of grating pads 26 extending from the first minor bus bar 46 being longitudinally offset 58 from the interdigital transducer electrodes 28. Alternative, and as illustrated with reference to FIG. 13A, one embodiment of the invention may include each of the plurality of grating pads 26 extending from the first minor bus bar 46 being longitudinally offset 58 from a cooperating one of the plurality of grating pads 26 extending from the second minor bus bar 48. Offsets 58 up to half a period have been shown to improve performance.

By way of example, one embodiment of the filter 12 illustrated with reference again to FIG. 8, may include the acoustic aperture 32 for each of the series arm SAW resonators 14 being less than twenty wavelengths, and each of the parallel arm SAW resonators 16 greater then thirty wavelengths.

During operation of the filter 12, a velocity of the SAW along the plurality of grating pads 26 is slower than a SAW velocity along the plurality of interdigital transducer electrodes 26, thus producing a wave guiding effect for optimizing SAW propagation within the acoustic aperture 32. When an RF electric voltage is applied across the transducer 36, an electric field is developed across the overlapping region of the active finger electrodes 28, thereby generating surface acoustic waves propagating at a velocity ($V_{IDT}$) as depicted with reference again to FIG. 9. The direction of the propagating waves is generally perpendicular to the finger electrodes 28. As above described, the transducer 36 is typically embedded between reflectors 42 so as to form the SAW resonator 10 as above described with reference to FIG. 7. The SAW resonator 10 may be used as an impedance element in either the series arm 14 or parallel arm 16 of a ladder network so as to form the SAW Resonator Ladder filter 12 as above described with reference to FIG. 8, by way of example. The SAW resonator is fabricated on a piezoelectric substrate 18 such as lithium tantalate, lithium niobate, quartz, and lithium tetra borate.

Figure 9:
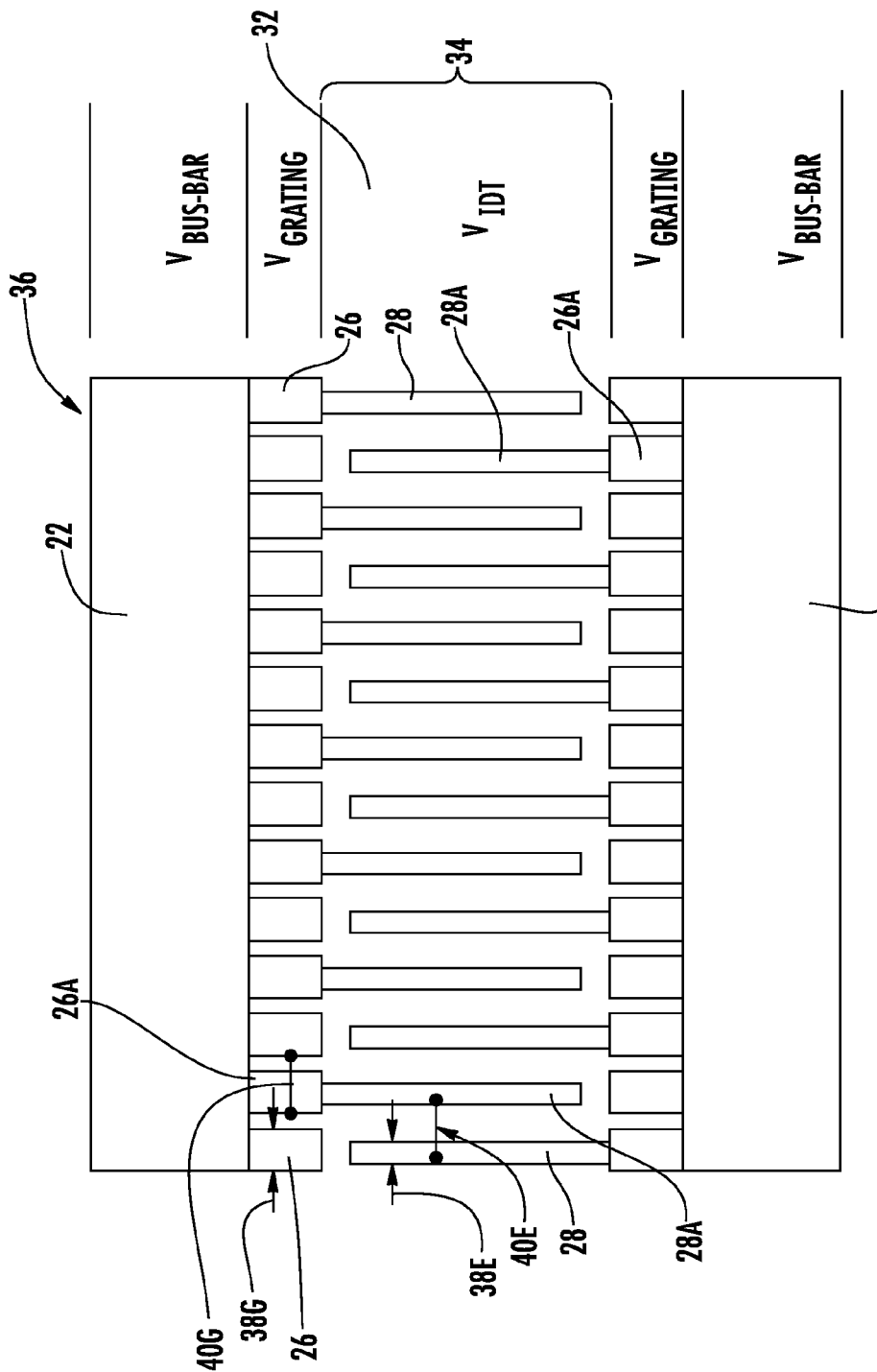
FIG. 9 illustrates features of the transducer of FIG. 7.

With attention given again to metalization ratio and FIG. 9, by way of example, the metalization ratio is the ratio of the width of a metal finger electrode to the distance between the adjacent fingers. By way of example, let 'a' be the width of the finger and Pa correspond to the periodicity of the finger electrode. The metalization ratio is then defined by $a/p_a$. The metalization ratio across the overlap region is $a/p_a$, while the metalization ratio along bus bar grating is $b/p_b$, where b is the width of the bus bar grating pad and $p_b$ is its corresponding periodicity. For embodiments herein described by way of example, the metalization ratio of the bus bar grating is significantly greater than that of the overlap active finger electrodes, i.e. $b/p_b > a/p_a$. The additional metallization at the bus bar grating effectively decreases the velocity within the edge grating so that $V_{GRATING} < V_{IDT}$. In doing so, the edge grating pads provide a wave guiding effect and reduce the leakage of the surface waves into the bus bar.

Figure 14:
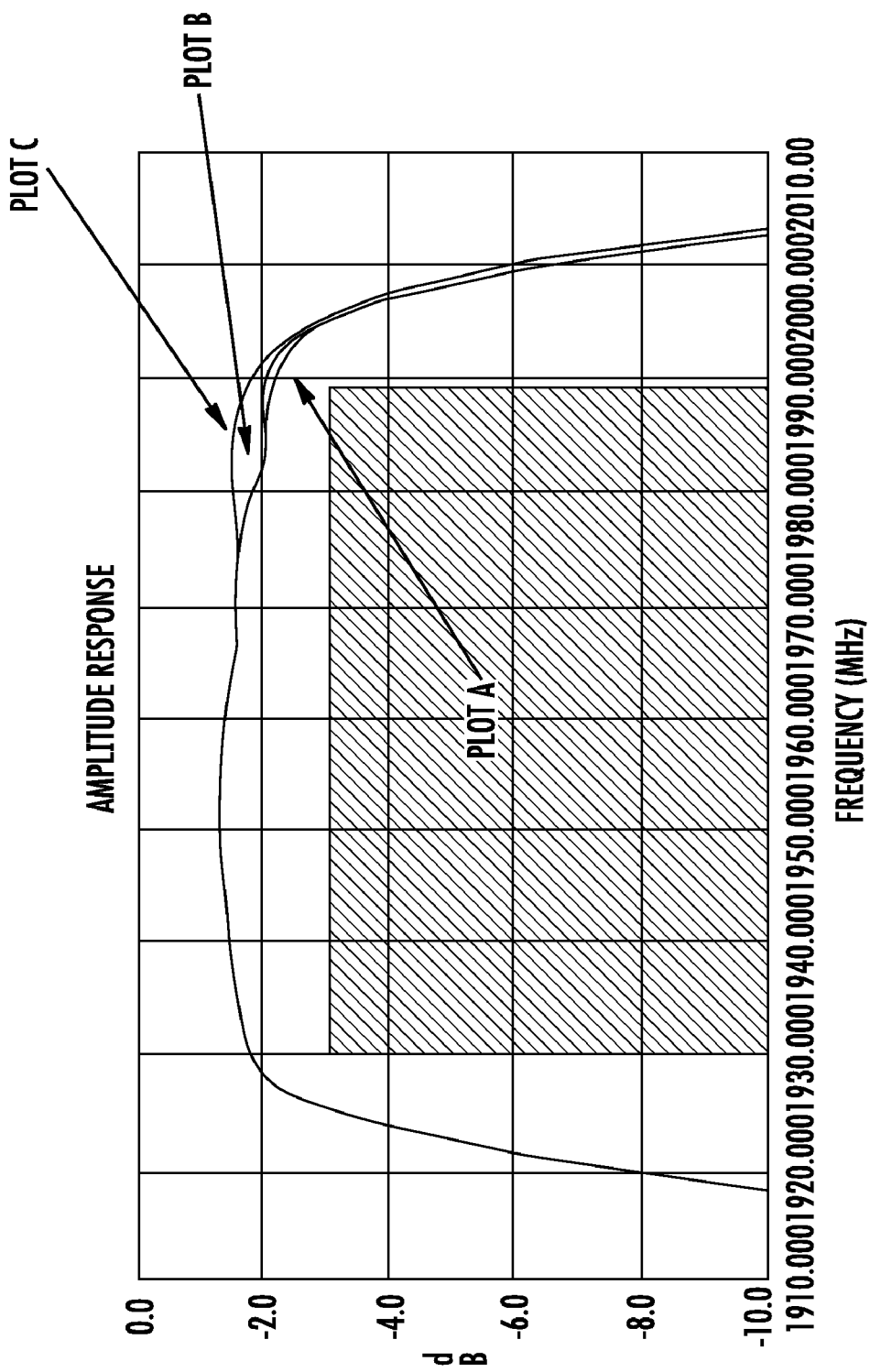
FIG. 14 is a frequency response ploy comparing one embodiment of the invention having a metalization ratio of the grating pads significantly greater than the metalization ration of the transducer electrodes.

As illustrated with reference to FIG. 14, pass band performances of three filter responses are presented. Response for Plot A corresponds to a known SAW resonator in which there is no grating pad along the bus bar. Plot B depicts amplitude response wherein the SAW transducer has a grating pad and the metalization ratio of the finger electrode is equal to that of the bus bar grating pads. Plot C is the amplitude response for an embodiment of the present invention in which the metalization ratio of the bus bar grating is significantly larger than that of the finger electrodes. The metalization ratio at the bus bar grating is 54%, while that of the active finger electrodes is 44%. The 10% difference in metalization ratio allows for sufficient decrease in velocity of the waves along the grating such that it effectively guides the waves along the aperture, thereby reducing leakage. The reduction in leakage is clearly shown in the upper pass band region, which exhibits a smoother and lower insertion loss as compared to responses A and B. A range of 5% to 40% difference in the metalization ratios of the two regions is very practical. A SAW transducer with a 50% metalization ratio at the active electrode fingers can have a 55% metalization ratio at the bus bar grating. However, if the metalization ratio is 35%, it is quite practical to achieve a metalization ratio of 75% at the bus bar pad grating.

Figure 15:
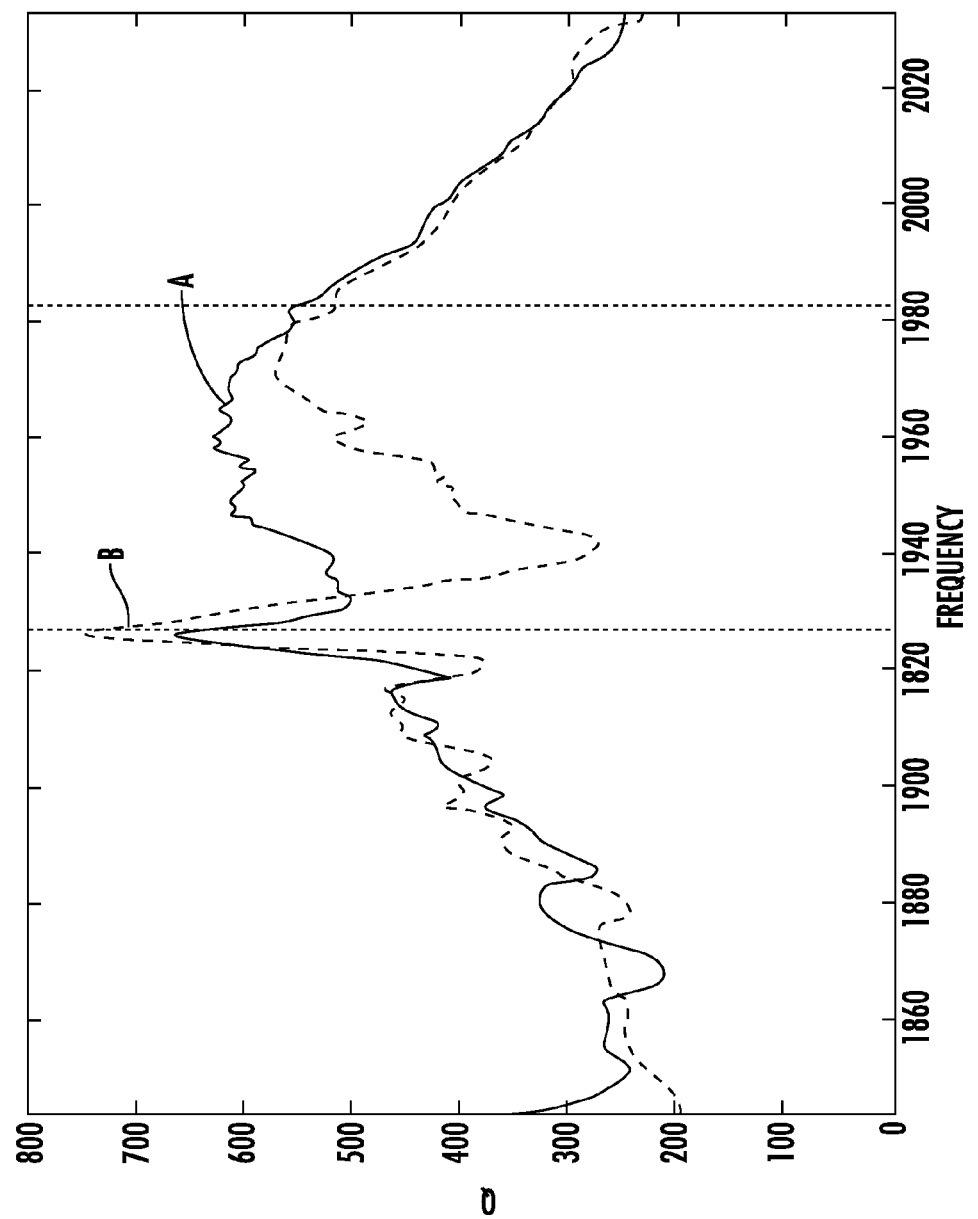
FIG. 15 is a plot of Q versus frequency for one embodiment of the invention.

FIG. 15 illustrates a plot of Q for two SAW resonators; resonator A has a substantially equal metalization ratio of 40% for both active electrode and bus bar grating regions while resonator B has a metalization ratio of 40% at the active electrode region and 60% at the bus bar grating. As clearly illustrated, the SAW resonator with a 20% difference in metalization ratio has a significant improvement in the Q measurement.

Figure 17:
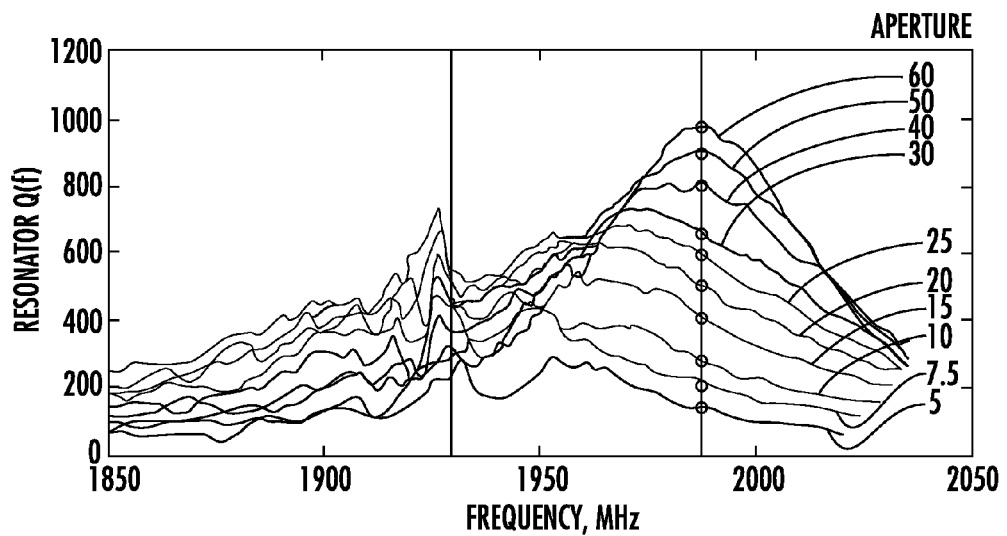
FIGS. 16 and 17 are plots of Q versus aperture in wavelengths and frequency, respectively, for embodiments of the present invention.
Figure 16:
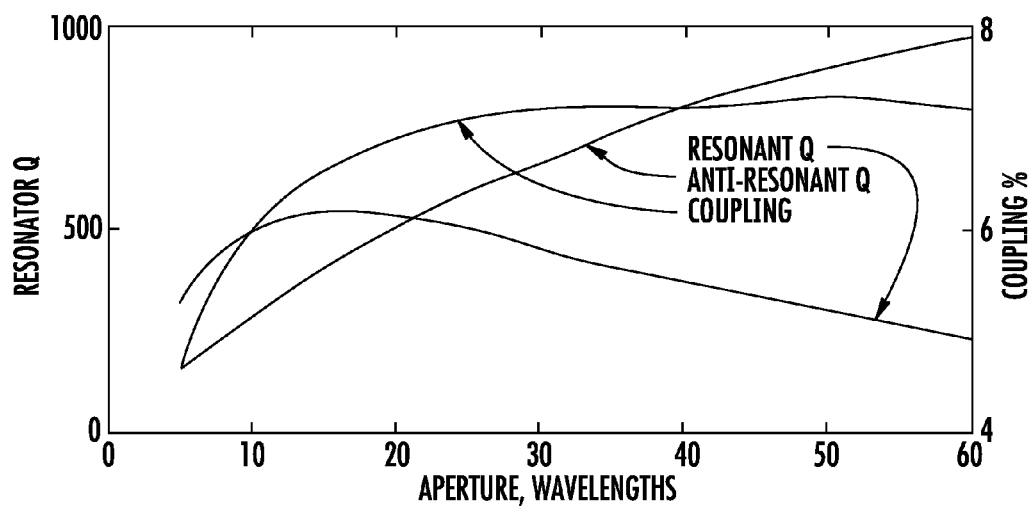

The acoustic aperture 32 of an interdigital transducer 36 affects the leakage of the surface acoustic waves. A series of experiments was conducted in which the Q of the resonator 10 was characterized over various apertures. A plot of resonator Q at resonant and anti-resonant frequencies versus apertures from 5 wavelengths through 60 wavelengths is illustrated in FIGS. 16 and 17. The resonator Q at anti-resonant frequency increases with an increment in the aperture; while the resonator Q at resonant frequency peaks at about 16 wavelengths and decreases with aperture beyond 20 wavelengths. One of skill in the art designing a SAW ladder filter would desire to achieve high Qs at the resonant frequency for the series arm resonator and at the anti-resonant frequency for the parallel arm resonator. Thus, as above described, it is desirous to implement a design for a high Q SAW ladder filter in which the aperture of the series arm SAW resonator is less than twenty wavelengths and that of the parallel arm SAW resonator is greater than 30 wavelengths.

Another embodiment of the present invention, as above described and illustrated with reference again to FIG. 10, comprises a SAW transducer 36 with opposing bus bars 22, 24 and grating pads 26 with metalization ratio given by $b/p_b$, with b being the width of the bus bar grating pad and $p_b$ is the corresponding periodicity. Additionally, minor bus bars 46, 48, connect the grating pads to the electrodes 28 and effectively reduce the resistive losses that may arise from the grating edge of the pads. As described earlier, the metalization ratio of the bus bar grating pads is significantly greater than that of the active electrode fingers to effectively reduce the surface acoustic energy leakage. With the addition of the minor bus bars 46, 48, it is possible to shift the synchronous grating pads 26 by as much as half a period as above described and illustrated with reference again to FIG. 13.

Yet another embodiment of the invention, as illustrated with reference again to FIG. 11, comprises a SAW transducer 36 in which the grating pads metalization is significantly greater than the metal thickness of the active electrodes 28 across the acoustic aperture 32. The additional metalization to the grating pads has the effect of decreasing the velocity within the edge grating and effectively reduces the energy leakage into the bus bar. Additional metalization can be added to the bus bar as well. The additional metal at the grating edge may be the same metal type as used in the transducer pattern or could be a different metal type.

Many modifications and other embodiments of the invention will come to the mind of one skilled in the art having the benefit of the teachings presented in the foregoing descriptions and the associated drawings and photos. Therefore, it is to be understood that the invention is not to be limited to the specific embodiments disclosed, and that modifications and alternate embodiments are intended to be included within the scope of the claims supported by this specification.

The invention claimed is:

1. A surface acoustic wave (SAW) filter having at least one resonator, the resonators comprising:
    a piezoelectric substrate having a surface supporting SAW propagation therewith;
    transversely opposing first and second bus bars longitudinally disposed on the surface;
    a plurality of grating pads transversely extending inwardly along the surface from each of the first and second opposing bus bars;
    a plurality of interdigital transducer electrodes disposed along a longitudinal axis on the surface for defining an acoustic aperture across overlapping interdigital transducer electrodes within a transverse dimension thereof, wherein each of the plurality of interdigital electrodes extends from one of the plurality of grating pads, and wherein a metalization ratio for the plurality of grating pads is substantially different from a metalization ratio for the plurality of interdigital transducer electrodes, wherein a height dimension of the grating pads is different than a height dimension of the interdigital transducer electrodes; and a plurality of reflector electrodes disposed on the surface of the piezoelectric substrate on opposing longitudinal sides of the plurality of interdigital electrodes.

2. A filter according to claim 1, wherein a first portion of the plurality of interdigital transducer electrodes extends from every other grating pad operable with the first bus bar, and a second portion of the plurality of interdigital transducer electrodes extends from every other grating pad associated with the second bus bar so as to form overlapping fingers of a SAW transducer within the acoustic aperture.

3. A filter according to claim 1, wherein the metalization ratio for the plurality of grating pads is greater that the metalization ratio for the interdigital transducer electrodes.

4. A filter according to claim 3, wherein the metalization ratio for the plurality of grating pads is between 5% and 40% greater than the metalization ratio for the interdigital transducer electrodes.

5. A filter according to claim 1, wherein each of the plurality of interdigital transducer electrodes comprises at least one of Al, Mg, Ti, Cu, Au, and an alloy thereof.

6. A filter according to claim 1, further comprising first and second minor bus bars disposed between at least one of each of the opposing bus bars and the plurality of grating pads, and the plurality of grating pads and the plurality of interdigital transducer electrodes.

7. A filter according to claim 6, wherein a height dimension for each of the opposing first and second minor bus bars is substantially equal to a height dimension for the transversely opposing first and second bus bars.

8. A filter according to claim 6, wherein each of the plurality of grating pads extending from the first minor bus bar is longitudinally offset from the interdigital transducer electrodes.

9. A filter according to claim 8, wherein the offset is up to half a period.

10. A filter according to claim 6, wherein each of the plurality of grating pads extending from the first minor bus bar is longitudinally offset from a cooperating one of the plurality of grating pads extending from the second minor bus bar.

11. A filter according to claim 1, wherein the height dimension for each of the plurality of grating pads is greater than a corresponding height dimension for each of the plurality of interdigital transducer electrodes, the height dimension for each of the plurality of grating pads being sufficient for reducing SAW energy leakage into the opposing bus bars.

12. A filter according to claim 1, wherein each of the plurality of interdigital transducer electrodes is electrically connected to a corresponding one grating pad of the plurality of grating pads extending from the first bus bar, and wherein an adjacent electrode is electrically connected to a second grating pad electrically connected to the second bus bar.

13. A filter according to claim 1, wherein operation of the filter results in a velocity of the SAW along the plurality of grating pads slower than a SAW velocity along the plurality of interdigital transducer electrodes, thus producing a wave guiding effect for optimizing SAW propagation within the acoustic aperture.

14. A surface acoustic wave (SAW) filter having at least one resonator, the at least one resonator comprising:

a piezoelectric substrate having a surface supporting SAW propagation therewith;

transversely opposing first and second bus bars longitudinally disposed on the surface;

a plurality of grating pads transversely extending inwardly along the surface from each of the first and second opposing bus bars;

a plurality of interdigital transducer electrodes disposed along a longitudinal axis on the surface for defining an acoustic aperture across overlapping interdigital transducer electrodes within a transverse dimension thereof, wherein each of the plurality of interdigital electrodes extends from one of the plurality of grating pads, and wherein a metalization ratio for the plurality of grating pads is substantially different from a metalization ratio for the plurality of interdigital transducer electrodes, wherein a metallic material used to form the plurality of grating pads is different from a metallic material used to form the plurality of interdigital transducer electrodes; and a plurality of reflector electrodes disposed on the surface of the piezoelectric substrate on opposing longitudinal sides of the plurality of interdigital electrodes.

15. A surface acoustic wave (SAW) filter having at least one series arm SAW resonator and at least one parallel arm SAW resonator connected in a ladder-like fashion, wherein an acoustic aperture for each of the series arm SAW resonators is less than twenty wavelengths, and wherein each of the parallel arm SAW resonators is greater then thirty wavelengths, the SAW filter comprising:

a piezoelectric substrate having a surface supporting SAW propagation therewith;

transversely opposing first and second bus bars longitudinally disposed on the surface;

a plurality of grating pads transversely extending inwardly along the surface from each of the first and second opposing bus bars;

a plurality of interdigital transducer electrodes disposed along a longitudinal axis on the surface for defining an acoustic aperture across overlapping interdigital transducer electrodes within a transverse dimension thereof, wherein each of the plurality of interdigital electrodes extends from one of the plurality of grating pads, and wherein a metalization ratio for the plurality of grating pads is substantially different from a metalization ratio for the plurality of interdigital transducer electrodes; and a plurality of reflector electrodes disposed on the surface of the piezoelectric substrate on opposing longitudinal sides of the plurality of interdigital electrodes.

16. A surface acoustic wave (SAW) filter comprising:

a piezoelectric substrate having a surface supporting SAW propagation therewith;

transversely opposing first and second bus bars longitudinally disposed on the surface;

a plurality of first and second grating pads transversely extending inwardly along the surface from each of the first and second opposing bus bars, respectively, a minor bus bar disposed between each of the transversely opposing first and second bus bars and the plurality of grating pads; and a plurality of interdigital transducer electrodes disposed along a longitudinal axis on the surface for defining an acoustic aperture across overlapping interdigital transducer electrodes within a transverse dimension thereof, wherein at least some of the plurality of interdigital electrodes extends from the plurality of grating pads, and wherein a metalization ratio for the plurality of grating pads is substantially different from a metalization ratio for the plurality of interdigital transducer electrodes, wherein each of the plurality of interdigital transducer electrodes extends from the first and second plurality of grating pads.

17. A filter according to claim 16, further comprising a plurality of reflector electrodes disposed on the surface of the piezoelectric substrate on opposing longitudinal sides of the plurality of interdigital electrodes.

18. A filter according to claim 16, wherein the metalization ratio for the plurality of grating pads is greater than the metalization ratio for the interdigital transducer electrodes.

19. A filter according to claim 18, wherein the metalization ratio for the plurality of grating pads is between 5% and 40% greater that the metalization ratio for the interdigital transducer electrodes.

20. A filter according to claim 16, wherein each of the plurality of grating pads extending from the first minor bus bar is longitudinally offset from the interdigital transducer electrodes.

21. A filter according to claim 16, wherein a height dimension for each of the opposing minor bus bars is substantially equal to a height dimension for the transversely opposing bus bars.

22. A filter according to claim 16, wherein each of the plurality of grating pads extending from the first bus bar is longitudinally offset from a cooperating one of the plurality of grating pads extending from the second bus bar.

23. A filter according to claim 22, wherein the offset is up to half a period.

24. A filter according to claim 16, wherein a height dimension for each of the plurality of first and second grating pads is sufficient for reducing SAW energy leakage into the opposing first and second bus bars.

25. A filter according to claim 16, wherein each of the plurality of interdigital transducer electrodes is electrically connected to a corresponding one grating pad of the plurality of grating pads extending from the first bus bar, and wherein an adjacent electrode is electrically connected to a second grating pad electrically connected to the second bus bar.

26. A surface acoustic wave (SAW) filter comprising:
a piezoelectric substrate having a surface supporting SAW propagation therewith;
transversely opposing first and second bus bars longitudinally disposed on the surface;
a plurality of grating pads transversely extending inwardly along the surface from each of the first and second opposing bus bars;
first and second minor bus bars disposed between at least one of each of the opposing first and second bus bars and the plurality of grating pads, and inward the plurality of grating pads; and
a plurality of interdigital transducer electrodes disposed along a longitudinal axis on the surface and extending from at least one of the first and second minor bus bars, and the plurality of grating pads, for defining an acoustic aperture across overlapping interdigital transducer electrodes within a transverse dimension thereof, wherein each of the plurality of interdigital electrodes is operable with the plurality of grating pads, and wherein a metalization ratio for the plurality of grating pads is substantially different from a metalization ratio for the plurality of interdigital transducer electrodes,
wherein a height dimension for each of the opposing first and second minor bus bars is less than a height dimension for at least one of the plurality of grating pads and the plurality of interdigital transducer electrodes.

27. A filter according to claim 26, further comprising a plurality of reflector electrodes disposed on the surface of the piezoelectric substrate on opposing longitudinal sides of the plurality of interdigital electrodes.

28. A filter according to claim 26, wherein the metalization ratio for the plurality of grating pads is greater than the metalization ratio for the interdigital transducer electrodes.

29. A filter according to claim 26, wherein the height dimension for each of the plurality of grating pads is sufficient for reducing SAW energy leakage into the opposing bus bars.

30. A filter according to claim 26, wherein each of the plurality of grating pads extending from the first minor bus bar is longitudinally offset from a cooperating one of the plurality of grating pads extending from the second minor bus bar.

* * * * *